United States Patent
Yamamoto et al.

(10) Patent No.: US 7,812,627 B2
(45) Date of Patent: Oct. 12, 2010

(54) TEST DEVICE

(75) Inventors: Yasuhito Yamamoto, Nirasaki (JP);
Yutaka Akaike, Nirasaki (JP); Shinya Kuroda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 93 days.

(21) Appl. No.: 12/251,751

(22) Filed: Oct. 15, 2008

(65) Prior Publication Data
US 2009/0096475 A1     Apr. 16, 2009

(30) Foreign Application Priority Data
Oct. 15, 2007     (JP)     ............... 2007-268363

(51) Int. Cl.
*G01R 31/02* (2006.01)
(52) U.S. Cl. ...................................... 324/760
(58) Field of Classification Search ............ None
See application file for complete search history.

(56) References Cited

U.S. PATENT DOCUMENTS

| | | | |
|---|---|---|---|
| 5,172,049 A * | 12/1992 | Kiyokawa et al. | ........... 324/760 |
| 5,325,052 A * | 6/1994 | Yamashita | ................... 324/754 |
| 6,583,638 B2 * | 6/2003 | Costello et al. | ............. 324/760 |
| 6,765,401 B2 * | 7/2004 | Hamada | ..................... 324/760 |
| 7,667,474 B2 * | 2/2010 | Sunohara et al. | ............. 324/760 |
| 2007/0182433 A1 * | 8/2007 | Natsuhara et al. | ........... 324/760 |
| 2007/0205788 A1 * | 9/2007 | Natsuhara et al. | ........... 324/760 |
| 2010/0013509 A1 * | 1/2010 | Setoguchi et al. | ........... 324/760 |

\* cited by examiner

*Primary Examiner*—Paresh Patel
(74) *Attorney, Agent, or Firm*—Oblon, Spivak, McClelland, Maier & Neustadt, L.L.P.

(57) ABSTRACT

A test device includes a movable mounting table having a temperature controlling mechanism therein; a probe card provided with a plurality of probes positioned above the mounting table; and a first temperature control unit for controlling the temperature controlling mechanism so that a target object on the mounting table can be heated to a predetermined temperature to test electrical characteristics of the target object. The mounting table is provided with a heater facing a plurality of probes protruding from the mounting table in the high-temperature test on the target object.

19 Claims, 4 Drawing Sheets

TEST DEVICE

FIELD OF THE INVENTION

The present invention relates to a test device for high-temperature testing a target object such as a semiconductor wafer by using a probe card; and, more particularly, to a test device capable of providing reliable test.

BACKGROUND OF THE INVENTION

A test device for high-temperature testing a target object (hereinafter, referred to as a "wafer") is provided with a loader chamber 1 and a prober chamber 2 which are arranged to be adjacent to each other as shown in FIG. 3.

The loader chamber 1 shown in FIG. 3 includes a mounting unit 3 for mounting thereon a cassette of wafers W, a wafer transfer mechanism (not shown) for transferring a wafer W from the cassette sheet by sheet and a sub-chuck (not shown) for pre-aligning the wafer W while transferring the wafer W. As shown in FIG. 3, the prober chamber 2 includes a wafer chuck 4 which a wafer W is mounted on and is horizontally moved by an XY table 4A, a card holder 6 provided in the center of a head plate 5 formed above the wafer chuck 4, a probe card 7 held by the card holder 6 and an alignment mechanism 8 for aligning probes 7A of the probe card 7 and electrode pads of the wafer W on the wafer chuck 4. While the wafer chuck 4 is horizontally moved by the XY table 4A, the electrode pads of the wafer W are aligned with the probes 7A by the alignment mechanism 8 and then the wafer W is heated to a predetermined temperature by a temperature controlling mechanism built in the wafer chuck 4 so that a high-temperature test on the wafer W can be performed.

As shown in FIG. 3, the alignment mechanism 8 includes a first imaging unit 8A for photographing the wafer W and a second imaging unit 8B for photographing the probes 7A, and the first imaging unit 8A moves between the rear end of the prober chamber 2 and the probe center through an alignment bridge 8C. The probe card 7 is electrically connected with a test head T via a coupling ring 9.

For example, in high-temperature testing a wafer W, the wafer W on the wafer chuck 4 is heated to around 150° C. by the temperature controlling mechanism provided in the wafer chuck 4 and the electrode pads of the wafer W are aligned with the probes 7A of the probe card 7 by the alignment mechanism 8. After that, the electrode pads of the wafer W are contacted with the probes 7A and the wafer W is overdriven to thereby test the wafer W at 150° C.

At the initial test stage, the wafer W is heated to a high temperature of 150° C. but the probe card 7 is not heated, thereby leading to a considerable temperature difference between the wafer W and the probes 7A. Therefore, if the probes 7A come in contact with the first chip of the wafer W for the test, the probe card 7 is gradually heated by the wafer W provided on the wafer chuck 4 and therefore thermally expands. Due to this thermal expansion, the position of the needle tip of the each probe 7A changes from the position where the needle tip has been aligned, which results in contact defects between the probes 7A and the electrode pads.

Disclosed in Japanese Patent Laid-open Publication No. 2004-266206 is a technique for preventing thermal expansion of a probe card 7, i.e. a main body, and probes 7A in the test by heating the probe card 7 to a test temperature with a heating plate used only for pre-heating just before the test. Further, while a wafer W mounted on a wafer chuck 4 is exchanged with a next wafer W, in order to prevent contraction of the probe card 7 due to cooling caused by separating the wafer chuck 4 from the probe card 7, the probe card 7 is maintained at the test temperature by the heating plate used only for pre-heating. However, in this technology, part of the probe card 7 protruding from the wafer chuck 4 during a test is cooled as shown in FIGS. 4A and 4B. If probes $7A_1$ in a cooled part of the probe card 7 come in contact with the wafer W by index-feeding of the wafer W, they may not make a sufficiently good contact with the electrode pads of the wafer W because the probes $7A_1$ are cooled and contracted more than the contacted probes 7A and therefore their tips become more distant from the wafer surface than those of the probes 7A do, which makes it difficult to test the devices of the wafer contacted with that part at a high temperature.

FIG. 4A shows a wafer W divided into four parts which are tested in an order of (1) to (4) and the dot part $7A_1$ indicates the probes protruding from the wafer chuck. Further, FIG. 4B is a side view of the probe card 7 in contact with the wafer W taken along the line B-B of FIG. 4A.

SUMMARY OF THE INVENTION

In view of the above, the present invention provides a test device capable of improving high-temperature test reliability by preventing the cooling of probes of a probe card protruding from a wafer chuck (mounting table) in a high-temperature test so that the probes can come in contact with a target object substantially at a same probe pressure as that of the other probes.

In accordance with an aspect of the present invention, there is provided a test device including a movable mounting table including a temperature controlling mechanism therein; a probe card provided with a plurality of probes positioned above the mounting table; and a first temperature control unit for controlling the temperature controlling mechanism so that a target object on the mounting table can be heated to a predetermined temperature to test electrical characteristics of the target object, wherein a heater is attached to the mounting table to face a plurality of probes protruding from the mounting table in the high-temperature test on the target object.

The heater may be provided in a portion horizontally protruded from the top portion of the mounting table.

The test device may further comprise a second temperature control unit for setting the plurality of probes protruding from the mounting table substantially at a same temperature as that of a plurality of probes in contact with the target object. The heater is connected to the second temperature control unit.

The first and second temperature control units may cooperate with each other.

In accordance with the present invention, there is provided a test device capable of improving high-temperature test reliability by preventing the cooling of probes of the probe card protruding from the wafer chuck (mounting table) in the high-temperature test so that the probes can come in contact with the target object substantially at the same probe pressure as that of the other probes.

BRIEF DESCRIPTION OF THE DRAWINGS

The above and other objects and features of the present invention will become apparent from the following description of preferred embodiments given in conjunction with the accompanying drawings, in which:

FIG. 1A is a plan view thereof and FIG. 1B is a partial cross-sectional view of a probe card in contact with a wafer on the wafer chuck;

FIGS. 4A and 4B show a position relationship between a conventional wafer chuck and a probe card, wherein FIG. 4A is a plan view and FIG. 4B is a side view of the probe card 7.

DETAILED DESCRIPTION OF THE EMBODIMENTS

Figure 1A:
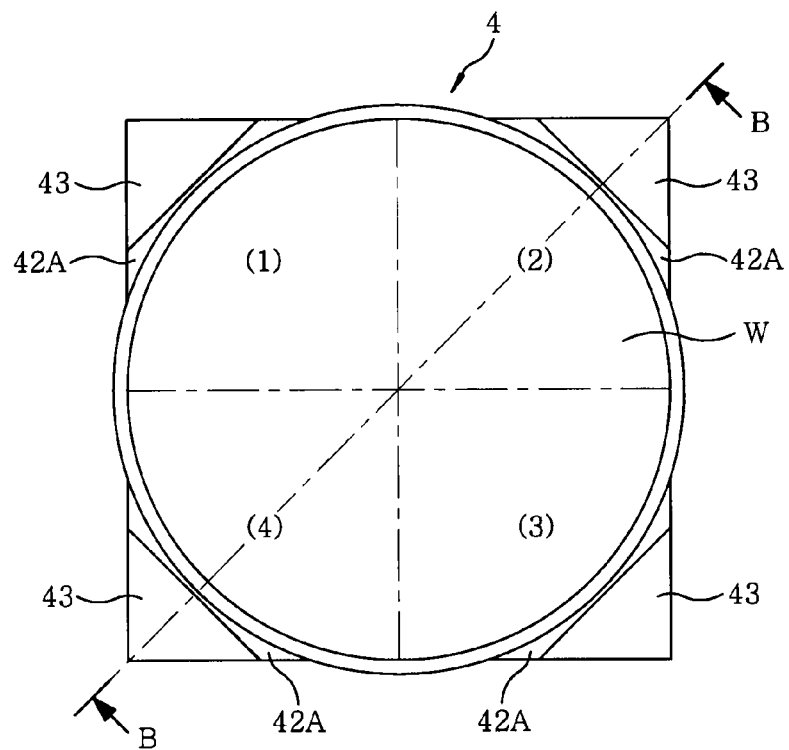
FIGS. 1A and 1B show a wafer chuck in accordance with an embodiment of a test device of the present invention, where

Hereinafter, embodiments of the present invention will be described in detail with reference to FIGS. 1A, 1B, 2A and 2B which form a part hereof.

The test device of the embodiment is provided with a loader chamber and a prober chamber similar to the conventional case. The prober chamber is provided with a movable wafer chuck, a probe card and an alignment mechanism and is basically identical to the conventional prober chamber except for the structure of the wafer chuck. Therefore, like reference numerals will be given to parts identical or similar to those described in the prior art.

Figure 1B:
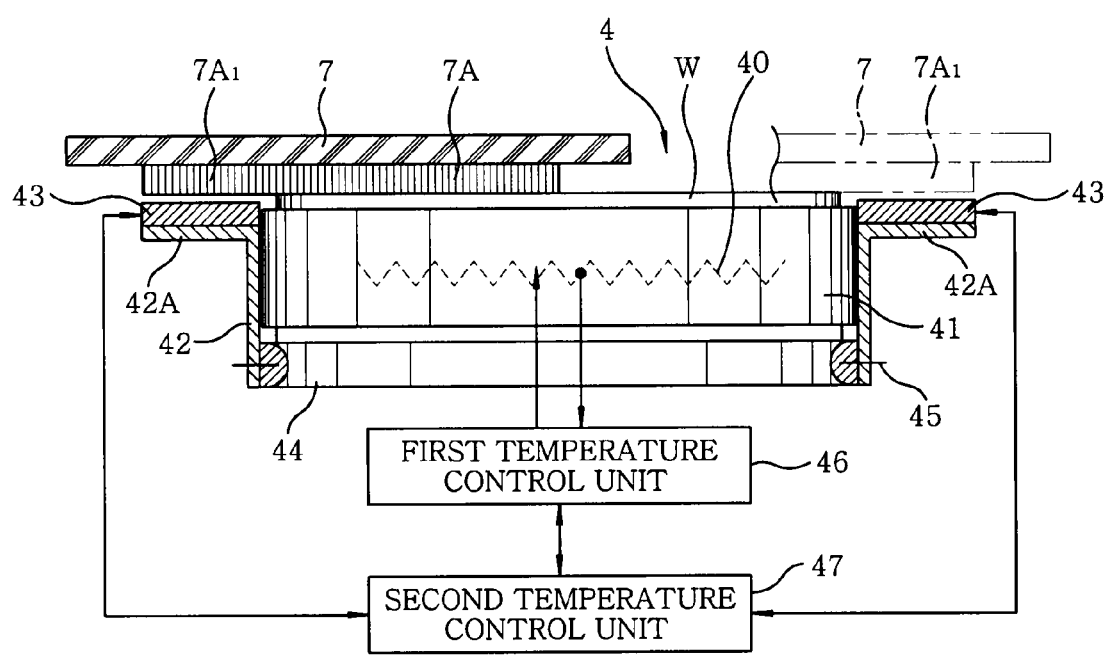

As shown in FIGS. 1A and 1B, a mounting table 4 (hereinafter, referred to as a "wafer chuck") used in the test device of the embodiment, for example, includes a wafer chuck main body 41 with a built-in temperature controlling mechanism 40, a cylindrical body 42 surrounding the outer peripheral portion of the wafer chuck main body 41 with a gap therebetween, heaters 43 installed on the top of four protruding parts 42A horizontally protruding at the top portion of the cylindrical body 42 and a base plate 44 for supporting the wafer chuck main body 41. The wafer chuck 4 is fixed to an XY table (not shown) via the base plate 44. The wafer chuck main body 41 has an elevating mechanism and can be rotated by a θ direction driving mechanism (not shown). Further, the lower portion of the cylindrical body 42 is fixed to the base plate 44 by a clamping member such as a screw 45 as shown in FIG. 1B.

As shown in FIGS. 1A and 1B, the four protruding parts 42A are located on radial directions which are circumferentially spaced apart by 90° around the wafer chuck main body 41 and extended angular sides thereof form a square shape. The plan shape of each protruding part 42A is a substantially right isosceles triangle. Each of the heaters 43 on the protruding parts 42A is formed of a substantially right isosceles triangle shape as shown in FIG. 1A. In the high-temperature test on the wafer W, if the probes 7A of the probe card 7 are electrically in contact with the wafer W mounted on the wafer chuck main body 41 as shown in FIG. 1B, a part of the probe card 7 protrudes from the wafer chuck main body 41 (i.e., a part of the probe card 7 is not directly above the wafer W) so that the probes $7A_1$ of that part are separated apart from the wafer W and exposed in the air.

The heaters 43 are arranged in parallel with the probes $7A_1$ protruding from the wafer chuck main body 41 with a gap formed between the heaters 43 and the probes $7A_1$ and cover the area of the probes $7A_1$. Therefore, the probes $7A_1$ protruding from the wafer chuck main body 41 are heated by the heaters 43 during the high-temperature test to substantially the same temperature as that of the probes 7A electrically connected with the wafer W.

For example, when the wafer chuck 4 index-feeds the wafer W in a clockwise direction from (1) to (4) as shown in FIG. 1A, the probes 7A of the probe card 7 corresponding to each heater 43 protrude. The heaters 43 heat the probes $7A_1$ protruding from the wafer chuck 4, which can be thus maintained at substantially the same temperature as that of the probes 7A electrically in contact with the wafer W on the wafer chuck main body 41.

The temperature controlling mechanism 40 provided in the wafer chuck main body 41 is connected to a first temperature control unit 46 as shown in FIG. 1B and the first temperature control unit 46 controls the temperature controlling mechanism 40 so that the wafer W on the mounting surface of the wafer chuck main body 41 can be set at a temperature required for the test. The temperature controlling mechanism 40 has a temperature sensor (not shown) for detecting the temperature of the mounting surface of the wafer chuck main body 41 and sets the mounting surface of the wafer chuck main body 41 at a predetermined temperature based on the temperature detected by the temperature sensor.

For example, to perform the high-temperature test on the wafer W at 150° C., the first temperature control unit 46 sets the temperature of the wafer W on the wafer chuck main body 41 at 150° C. by controlling the temperature controlling mechanism 40 based on the temperature detected by the temperature sensor. On the other hand, to perform a low-temperature test on the wafer W, the first temperature control unit 46 controls the temperature controlling mechanism 40 so that the wafer W can be cooled to a temperature required for the low-temperature test. The temperature controlling mechanism 40 includes a heating unit and a cooling unit.

Further, the heaters 43 are connected to a second temperature control unit 47 which sets the temperature of the heaters 43 as shown in FIG. 1B. The heaters 43 are provided with a temperature sensor (not shown) and the second temperature control unit 47 maintains the heaters 43 at a predetermined temperature based on the temperature detected by the temperature sensor. Further, the second temperature control unit 47 and the first temperature control unit 46 are connected to each other as shown in FIG. 1B so that they can cooperate with each other.

For example, if the wafer W is set at 150° C., the heaters 43 heat the probes $7A_1$ protruding from the wafer chuck main body 41 so that they can be at substantially the same temperature as that of the probes 7A electrically in contact with the wafer W. Since the first and second temperature control units 46 and 47 cooperate with each other, the set temperature of the heaters 43 can be adjusted based on the set temperature of the mounting surface of the wafer chuck main body 41.

Next, an operation of the test device for the high-temperature test will be described. When a wafer W from the loader chamber is loaded on the wafer chuck 4 heated in advance to a temperature required for the high-temperature test, electrode pads of the wafer W on the wafer chuck main body 41 and the probes 7A of the probe card 7 are aligned by using an alignment mechanism (not shown). After the alignment, the wafer chuck 4 moves wafer W to a position for an initial test by the XY table (not shown) and then lifts the wafer W up by using the elevating mechanism provided in the wafer chuck main body 41 until it contacts with the probes 7A of the probe card 7. Then, by overdriving the wafer W, the electrode pads of the wafer W are made to be electrically contacted with the probes 7A. At this time, the probes 7A of the probe card 7 are electrically connected with the electrode pads of the devices in the region (1) of the wafer W shown in FIG. 1A.

During the high-temperature test of the devices in the region (1) of the wafer W, the probes $7A_1$ in the upper left part of the probe card 7 protruding from the region (1) of the wafer W shown in FIG. 1A is heated by the heater 43, so that they can be maintained at substantially the same temperature as that of the probes 7A in contact with the wafer W. If the high-temperature test of the devices in the region (1) of the wafer W is completed, the wafer chuck main body 41 is lowered by the elevating mechanism to thereby separate the wafer W from the probes 7A of the probe card 7. Then, the wafer chuck 4 index-feeds the wafer W by using the XY table so that the region (2) of the wafer W can be positioned under the probe card 7. At this position, the wafer W and the probes 7A of the probe card 7 are then electrically connected with each other by the elevating mechanism of the wafer chuck 4, thereby performing the high-temperature test of the devices in the region (2) of the wafer W.

At this time, the probes $7A_1$ of the upper left part of the probe card 7 protruded from the region (1) of the wafer W during the high-temperature test in the region (1) make contact with the wafer W in the region (2). On the other hand, the probes $7A_1$ of the upper right part of the probe card 7 protrude from the region (2) of the wafer W. Here, since the probes $7A_1$ of the upper left part were heated by the heater 43, they have maintained at substantially the same temperature as that of the probes 7A which were made to be in contact with the wafer W.

Therefore, when the probes $7A_1$ come in contact with the devices in the region (2) of the wafer W, they are electrically in contact with the electrode pads of the wafer W substantially at a same probe pressure as that of the probes 7A, thereby achieving the precise high-temperature test of the devices. When respective high-temperature tests of regions (3) and (4) of the wafer W are continued after the completion of the high-temperature test of the region (2) of the wafer W, the probes $7A_1$ protruding from the wafer W in the previous test was heated by the heaters 43 and therefore have been maintained at substantially the same temperature as that of the probes 7A which were made to be in contact with the wafer W. Therefore, the reliable and stable high-temperature test can be performed. If the high-temperature test on the wafer W is finished, the high-temperature test is performed on a next wafer W in the same manner.

That is, as described in the above preferred embodiment, because the heaters 43 facing the probes $7A_1$ protruding from the wafer chuck 4 during the high-temperature test on the wafer W are provided with the wafer chuck 4, the probes $7A_1$ protruding from the wafer chuck 4 during the high-temperature test on the wafer W are maintained at substantially the same temperature as that of the probes 7A in contact with the wafer W. Thus, although the probes $7A_1$ protruding from the wafer chuck 4 as well as the probes 7A come in contact with the wafer W by index-feeding of the wafer W, they can be electrically in contact with the wafer W substantially at the same probe pressure as that of the probes 7A, thereby resulting in the precise high-temperature test with high reliability.

In accordance with the embodiment, since the first and second temperature control units 46 and 47 cooperate with each other, the set temperature of the heaters 43 can be adjusted based on the set temperature of the mounting surface of the wafer chuck main body 41.

Although the above embodiment has been described with the four heaters 43 circumferentially spaced by 90° around the wafer chuck main body 41, a heater 43 for the probes $7A_1$ which protrude in the last contact by index-feeding of the wafer W may not be installed.

Figure 2A:
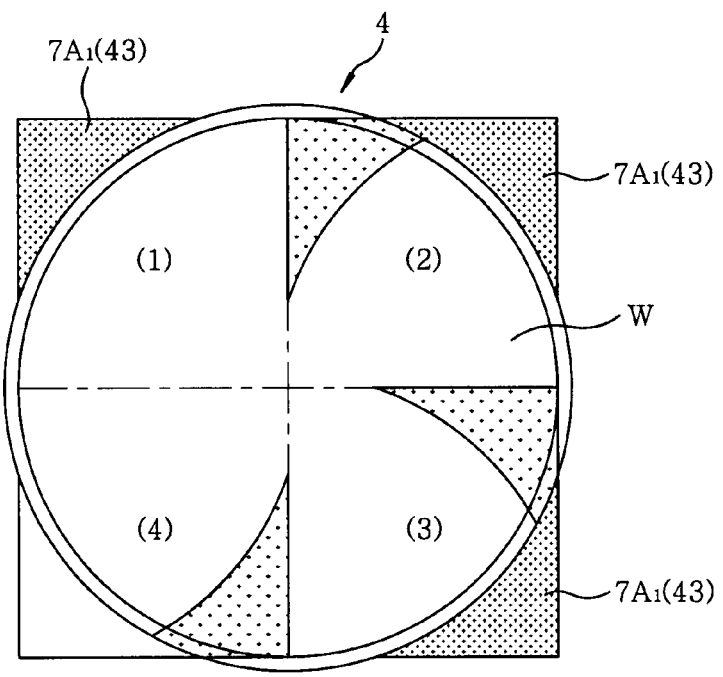
FIGS. 2A and 2B show plan views of the wafer chucks where index-feeding directions of the wafers are different.

For example, as shown in FIG. 2A, if a wafer W is divided into four parts as described in the above embodiment and index-fed in a clockwise direction from (1) to (4), the probes $7A_1$ of the probe card 7 protruding from the wafer chuck 4 in the previous test, which are indicated by sparse dots, are placed within the wafer chuck 4 and electrically come in contact with the wafer W at substantially the same probe pressure as that of the probes 7A of other part so that the reliable high-temperature test can be performed. In case of the high-temperature test of the last region (4) of the wafer W, the probes $7A_1$ protruding from the wafer chuck 4 need not be heated because the wafer W is not index-fed any more. Therefore, a heater 43 in that region can be omitted.

Figure 2B:
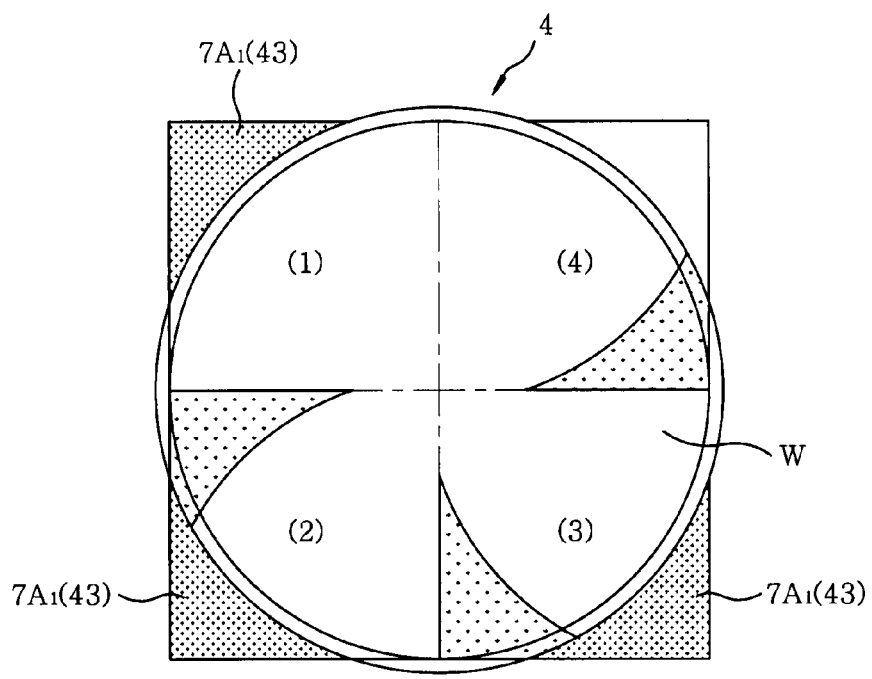
Figure 3:
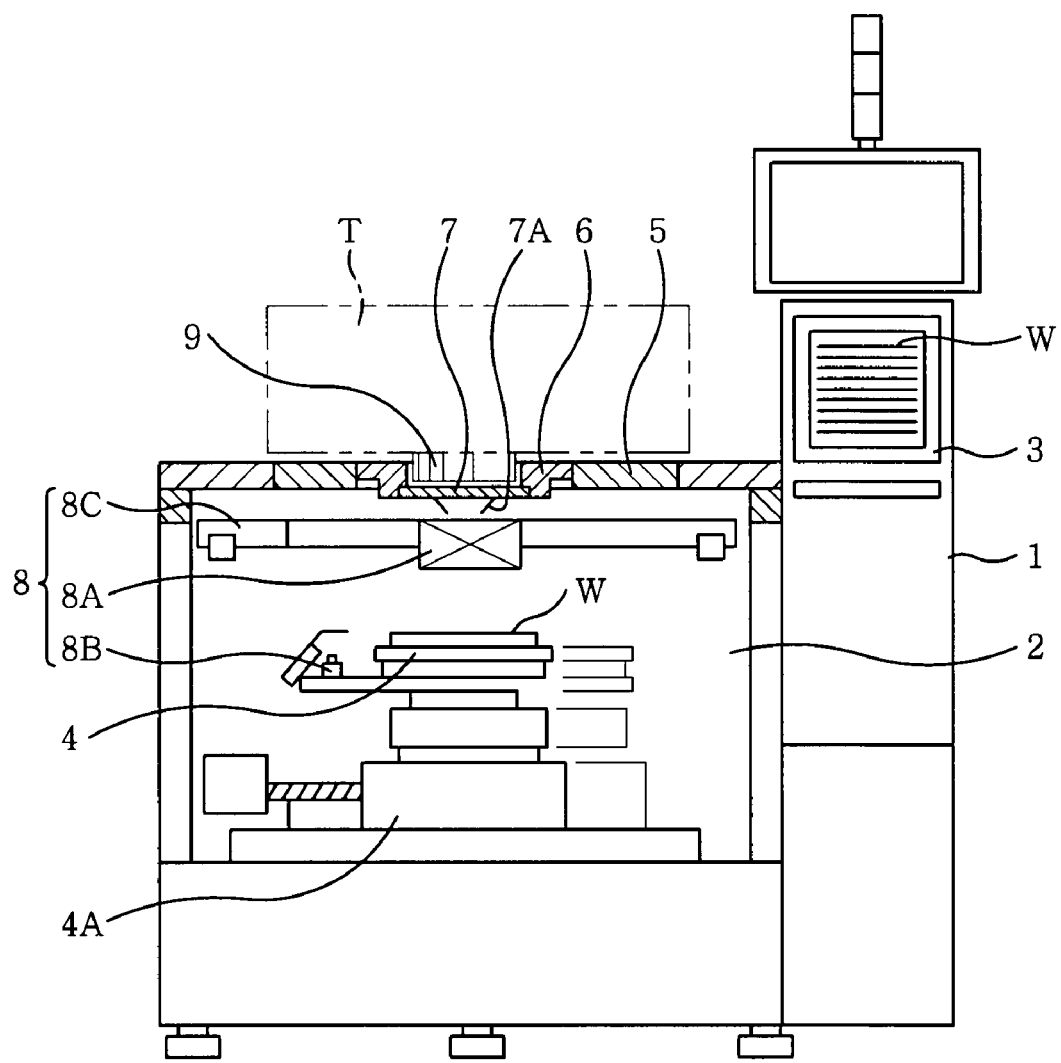
FIG. 3 is a partial sectional front view of a prober chamber of an exemplary conventional test device.
Figure 4A:
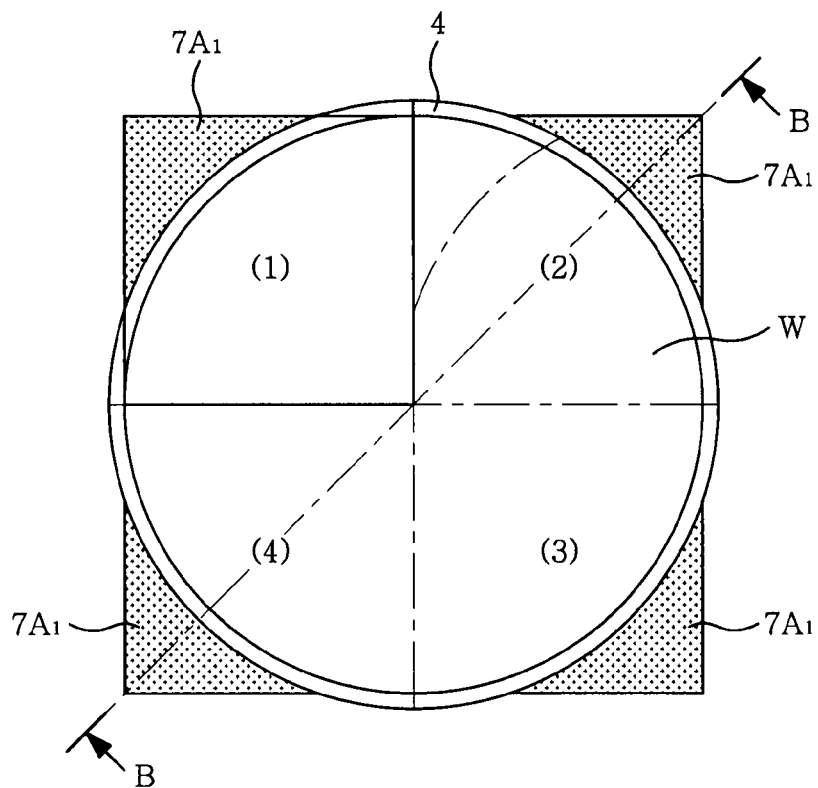
Figure 4B:
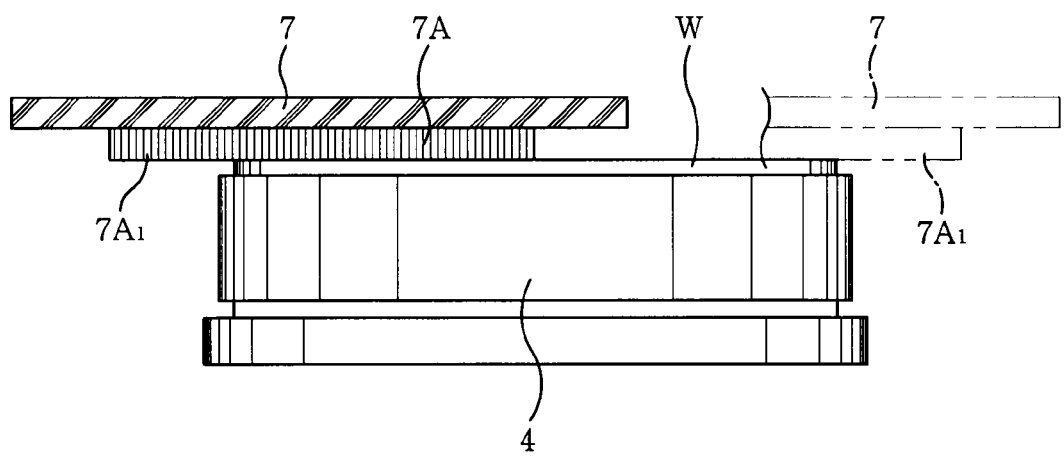

Further, as shown in FIG. 2B, if a wafer W is index-fed in a counterclockwise direction from (1) to (4), the probes $7A_1$ of the probe card 7 protruding from the wafer chuck 4 in the previous test, which are indicated by sparse dots, are placed within the wafer chuck 4 and electrically come in contact with the wafer W at substantially the same probe pressure as that of the probes 7A of other part so that the reliable high-temperature test can be performed. In case of the high-temperature test of the last region (4) of the wafer W, the probes $7A_1$ protruding from the wafer chuck 4 need not be heated because the wafer W is not index-fed any more. Therefore, a heater 43 in that region can be omitted.

The present invention may be applied in a test device for high-temperature testing a target object such as a semiconductor wafer.

While the invention has been shown and described with respect to the preferred embodiments, it will be understood by those skilled in the art that various changes and modifications may be made without departing from the spirit and scope of the invention as defined in the following claims.

What is claimed is:

1. A test device comprising:
   a movable mounting table for mounting a target object on a top portion thereof, the mounting table including a temperature controlling mechanism therein;
   a probe card provided with a plurality of probes positioned above the mounting table;
   a first temperature control unit that controls the temperature controlling mechanism to heat the target object mounted on the mounting table to a predetermined temperature to test electrical characteristics of the target object; and
   a plurality of heaters provided at protruding parts horizontally protruded from the top portion of the mounting table,
   wherein in a high-temperature test on the target object, the heaters serve to heat a part of the probes which is not disposed directly above the mounting table while another part of the probes is electrically in contact with the target object on the mounting table.

2. The test device of claim 1, further comprising a second temperature control unit that sets the part of the probes which is not disposed directly above the mounting table substantially at the same temperature as that of said another part of the probes in contact with the target object.

3. The test device of claim 2, wherein the first and second temperature control units cooperate with each other.

4. The test device of claim 1, wherein the number of the heaters is four.

5. The test device of claim 4, wherein the four heaters are located on radial directions which are circumferentially spaced part by 90° around the top portion.

6. The test device of claim 1, wherein the number of the heaters is three and are located on three of four locations circumferentially spaced apart by 90° around the top portion.

7. The test device of claim 1, wherein each of the heaters has a substantially right isosceles triangle shape.

8. The test device of claim 1, wherein the area of the heaters substantially identical to that of the part of the probes which are not disposed directly above the mounting table.

9. The test device of claim 1, wherein when said part of the probes is electrically in contact with the target object, the heaters face said part of the probes not disposed directly above the mounting table.

10. A test device comprising:
- a movable mounting table for mounting a target object on a top portion thereof, the mounting table including a temperature controlling mechanism therein;
- a probe card provided with a plurality of probes positioned above the mounting table;
- a first temperature control unit that controls the temperature controlling mechanism to heat the target object mounted on the mounting table to a predetermined temperature to test electrical characteristics of the target object;
- a plurality of heaters attached to the mounting table that heats the probes; and
- a second temperature control unit that controls the heaters so that in a high-temperature test on the target object, the heaters serve to heat a part of the probes which is not disposed directly above the mounting table while another part of the probes is electrically in contact with the target object on the mounting table.

11. The test device of claim 10, wherein the heaters are provided at protruding parts horizontally protruded from the top portion of the mounting table.

12. The test device of claim 10, wherein the second temperature control unit sets the part of the probes which is not disposed directly above the mounting table substantially at the same temperature as that of said another part of the probes in contact with the target object.

13. The test device of claim 10, wherein the first and second temperature control units cooperate with each other.

14. The test device of claim 10, wherein the number of the heaters is four.

15. The test device of claim 14, wherein the four heaters are located on radial directions which are circumferentially spaced part by 90° around the top portion.

16. The test device of claim 10, wherein the number of the heaters is three and are located on three of four locations circumferentially spaced apart by 90° around the top portion.

17. The test device of claim 10, wherein each of the heaters has a substantially right isosceles triangle shape.

18. The test device of claim 10, wherein the area of the heaters substantially identical to that of the part of the probes which are not disposed directly above the mounting table.

19. The test device of claim 10, wherein when said part of the probes is electrically in contact with the target object, the heaters face said part of the probes not disposed directly above the mounting table.

* * * * *